United States Patent
Shrivastava

(10) Patent No.: US 11,239,806 B2
(45) Date of Patent: Feb. 1, 2022

(54) HIGH STABILITY GAIN STRUCTURE AND FILTER REALIZATION WITH LESS THAN 50 PPM/° C. TEMPERATURE VARIATION WITH ULTRA-LOW POWER CONSUMPTION USING SWITCHED-CAPACITOR AND SUB-THRESHOLD BIASING

(71) Applicant: Northeastern University, Boston, MA (US)

(72) Inventor: Aatmesh Shrivastava, Boston, MA (US)

(73) Assignee: Northeastern University, Boston, MA (US)

( * ) Notice: Subject to any disclaimer, the term of this patent is extended or adjusted under 35 U.S.C. 154(b) by 1 day.

(21) Appl. No.: 16/829,802

(22) Filed: Mar. 25, 2020

(65) Prior Publication Data

US 2020/0313636 A1 Oct. 1, 2020

Related U.S. Application Data

(60) Provisional application No. 62/823,334, filed on Mar. 25, 2019.

(51) Int. Cl.
*H03F 3/45* (2006.01)
*H03F 3/00* (2006.01)
*H03F 1/30* (2006.01)

(52) U.S. Cl.
CPC ........... *H03F 3/45071* (2013.01); *H03F 1/30* (2013.01); *H03F 3/005* (2013.01); *H03F 2200/267* (2013.01); *H03F 2200/513* (2013.01)

(58) Field of Classification Search
CPC ........ H03F 3/45071; H03F 3/005; H03F 1/30; H03F 2200/513; H03F 2200/267;
(Continued)

(56) References Cited

U.S. PATENT DOCUMENTS 6,191,637 B1 * 2/2001 Lewicki ................. G05F 3/245
323/316
10,812,056 B1 * 10/2020 Wu ....................... H03K 3/0315
(Continued)

OTHER PUBLICATIONS

"NSF Industry-University Cooperation Center—Center for Hardware and Embedded Systems Security and Trust (CHEST)," https://nsfchest.org.
(Continued)

*Primary Examiner* — Hieu P Nguyen
(74) *Attorney, Agent, or Firm* — Foley Hoag LLP; Dana M. Gordon; Rajesh Vallabh

(57) ABSTRACT

An ultra-low power sub-threshold $g_m$ stage is disclosed where transconductance is very stable with process, temperature, and voltage variations. This technique can be implemented in a differential amplifier with constant gain and a second order biquad filter with constant cut off frequency. The amplifier gain can achieve a small temperature coefficient of 48.6 ppm/° C. and exhibits small sigma of 75 mdB with process. The second order biquad can achieve temperature stability of 69 ppm/° C. and a voltage coefficient of only 49 ppm/mV.

15 Claims, 11 Drawing Sheets

(58) Field of Classification Search
CPC ....... H03F 3/45475; H03F 2203/45246; H03F 3/45183; H03H 11/0433
USPC .......................................... 330/252–261, 289
See application file for complete search history.

(56) References Cited

U.S. PATENT DOCUMENTS

2020/0311535 A1  10/2020  Shrivastava
2020/0313636 A1  10/2020  Shrivastava

OTHER PUBLICATIONS

Abdelfattah et al., "A chopper instrumentation amplifier with fully symmetric negative capacitance generation feedback loop and online digital calibration for input impedance boosting," in 2019 IEEE Midwest Symposium on Circuits and Systems (MWSCAS), pp. 1-4 (2019).
Agarwal et al., "A pvt independent subthreshold constant—gm stage for very low frequency applications," In 2008 IEEE International Symposium on Circuits and Systems, pp. 2909-2912 (2008).
Amaravati et al., "A fully on-chip ptinvariant transconductor," IEEE Transactions on Very Large Scale Integration (VLSI) Systems, 23(9):1961-1964 (2015).
Ambrogio et al., "Equivalent-accuracy accelerated neural-network training using analogue memory," Nature, 558(7708):60-67 (2018).
Antao et al., "A 9-nw on-chip constant subthreshold cmos transconductance bias with fine-tuning," In 2017 IEEE International Symposium on Circuits and Systems (ISCAS), pp. 1-4 (2017).
Arya et al., "Gm-c biquad filter for low signal sensor applications," In 2016 MIXDES—23rd International Conference Mixed Design of Integrated Circuits and Systems, pp. 207-210 (2016).
Badin et al., "Evaluation of evs energy consumption influencing factors, driving conditions, auxiliaries use, driver's aggressiveness," in 2013 World Electric Vehicle Symposium and Exhibition (EVS27), pp. 1-12 (2013).
Bankman et al., "An always-on 3.8 μj/86% cifar-10 mixed-signal binary cnn processor with all memory on chip in 28nm cmos," in 2018 IEEE International Solid-State Circuits Conference—(ISSCC), pp. 222-224 (2018).
Beckmann et al., "Nanoscale hafnium oxide rram devices exhibit pulse dependent behavior and multi-level resistance capability," MRS Advances, 1(49):3355-3360 (2016).
Binkert et al., "The gem5 simulator," SIGARCH Comput. Archit. News, 39(2):1-7 (2011).
Bojarski et al., "End to end learning for self-driving cars," (2016).
Calhoun et al., "Modeling and sizing for minimum energy operation in subthreshold circuits," IEEE Journal of Solid-State Circuits, 40(9):1778-1786 (2005).
Chen et al., "Data mining for the online retail industry: A case study of rfm model-based customer segmentation using data mining," Journal of Database Marketing & Customer Strategy Management, 19(3):197-208 (2012).
Chen et al., "Novel constant transconductance references and the comparisons with the traditional approach," Southwest Symposium on Mixed-Signal Design, pp. 104-107 (2003).
Chu et al., "A pvt-independent constant-gm bias technique based on analog computation," IEEE Transactions on Circuits and Systems II: Express Briefs, 61(10):768-772 (2014).
Cong et al., "Parade: A cycle-accurate full-system simulation platform for accelerator-rich architectural design and exploration," in 2015 IEEE/ACM International Conference on Computer-Aided Design (ICCAD), pp. 380-387 (2015).
Courbariaux et al., "Binaryconnect: Training deep neural networks with binary weights during propagations," in Advances in Neural Information Processing Systems 28, C. Cortes, N. D. Lawrence, D. D. Lee, M. Sugiyama, and R. Garnett, Eds. Curran Associates, Inc., pp. 3123-3131 (2015).
Cowan et al., "A vlsi analog computer/digital computer accelerator," IEEE Journal of Solid-State Circuits, 41(1):42-53 (2006).
Cowan et al., "A vlsi analog computer/math co-processor for a digital computer," in ISSCC. 2005 IEEE International Digest of Technical Papers. Solid-State Circuits Conference, 1:82-586 (2005).
Dreslinski et al., "Nearthreshold computing: Reclaiming moore's law through energy efficient integrated circuits," Proceedings of the IEEE, 98(2):253-266 (2010).
El-Hassan et al., "Modelling of wire resistance effect in pcm-based nanocrossbar memory," The Journal of Engineering, 2016(10):357-362 (2016).
Enz et al., "Circuit techniques for reducing the effects of op-amp imperfections: autozeroing, correlated double sampling, and chopper stabilization," Proceedings ofthe IEEE, 84(11):1584-1614 (1996).
Farabet et al., "An fpga-based stream processor for embedded real-time vision with convolutional networks," in 2009 IEEE 12th International Conference on Computer Vision Workshops, ICCV Workshops, pp. 878-885 (2009).
Girshick et al., "Rich feature hierarchies for accurate object detection and semantic segmentation," in Proceedings of the 2014 IEEE Conference on Computer Vision and Pattern Recognition, ser. CVPR '14. Washington, DC, USA: IEEE Computer Society pp. 580-587 (2014).
Girshick, "Fast R-CNN," CoRR, vol. abs/1504.08083 (2015).
Goodfellow et al., "Generative adversarial nets," in Advances in Neural Information Processing Systems 27, Z. Ghahramani, M. Welling, C. Cortes, N. D. Lawrence, and K. Q. Weinberger, Eds. Curran Associates, Inc., pp. 2672-2680 (2014).
Gregoire et al., "A sub 1-v constant gm ndash; c switched-capacitor current source," IEEE Transactions on Circuits and Systems II: Express Briefs, 54(3):222-226 (2007).
Guo et al., "Energy-efficient hybrid analog/digital approximate computation in continuous time," IEEE Journal of Solid-State Circuits, 51(7):1514-1524 (2016).
Hahnle et al., "Fpga-based real-time pedestrian detection on high-resolution images," in The IEEE Conference on Computer Vision and Pattern Recognition (CVPR) Workshops (2013).
He et al., "Customized binary and multilevel hfo2x-based memristors tuned by oxidation conditions," Scientific Reports, 7(1):10070 (2017).
He et al., "Deep residual learning for image recognition," CoRR, vol. abs/1512.03385 (2015).
Hennessy et al., "Computer Architecture, Fifth Edition: A Quantitative Approach," 5th ed. San Francisco, CA, USA: Morgan Kaufmann Publishers Inc. (2011).
Huang et al., ""Evaluation of an analog accelerator for linear algebra,"" in 2016 ACM/IEEE 43rd Annual International Symposium on Computer Architecture (ISCA), pp. 570-582 (2016).
Huang et al., "Hybrid analog-digital solution of nonlinear partial differential equations," in Proceedings of the 50th Annual IEEE/ACM International Symposium on Microarchitecture, ser. MICRO-50 '17. New York, NY, USA: ACM, pp. 665-678 (2017).
Huang et al., "Yolo-lite: A real-time object detection algorithm optimized for non-gpu computers," 2018 IEEE International Conference on Big Data (Big Data) (2018).
Jaderberg et al., "Spatial transformer networks," in Advances in Neural Information Processing Systems 28, C. Cortes, N. D. Lawrence, D. D. Lee, M. Sugiyama, and R. Garnett, Eds. Curran Associates, Inc., pp. 2017-2025 (2015).
Jansen et al., "Complementary constant—gm biasing of nauta-transconductors in low-power gm x2013;c filters to x00b1;2," IEEE Journal of SolidState Circuits, 48(7):1585-1594 (2013).
Jeng, "Design and Modeling of Deep-Submicrometer MOSFETs," PhD thesis, University of California (1989).
Jouppi et al., "Indatacenter performance analysis of a tensor processing unit," in 2017 ACM/IEEE 44th Annual International Symposium on Computer Architecture (ISCA), pp. 1-12 (2017).
Karpathy et al., "Deep visual-semantic alignments for generating image descriptions," IEEE Transactions on Pattern Analysis and Machine Intelligence, 39(4):664-676 (2017).

(56) References Cited

OTHER PUBLICATIONS

Kingra et al., "Methodology for Realizing VMM with Binary RRAM Arrays: Experimental Demonstration of Binarized-ADALINE Using OxRAM Crossbar," Conference paper at ISCAS (2020).

Klinefelter et al., "A 6.45 µw self-powered iot soc with integrated energy-harvesting power management and ulp asymmetric radios," in 2015 IEEE International Solid-State Circuits Conference—(ISSCC) Digest of Technical Papers, pp. 1-3 (2015).

Krizhevsky et al., "Imagenet classification with deep convolutional neural networks," in Advances in Neural Information Processing Systems 25, F. Pereira, C. J. C. Burges, L. Bottou, and K. Q. Weinberger, Eds. Curran Associates, Inc., pp. 1097-1105 (2012).

LeCun, "1.1 deep learning hardware: Past, present, and future," in 2019 IEEE International Solid-State Circuits Conference—(ISSCC), pp. 12-19 (2019).

Lee et al., "24.2 a 2.5ghz 7.7tops/w switched-capacitor matrix multiplier with co-designed local memory in 40nm," in 2016 IEEE International SolidState Circuits Conference (ISSCC), pp. 418-419(2016).

Lee et al., "Analysis and design of a passive switched-capacitor matrix multiplier for approximate computing," IEEE Journal of Solid-State Circuits, 52(1):261-271 (2017).

Li et al., "Analogue signal and image processing with large memristor crossbars," Nature Electronics, 1:52-59 (2017).

LiKamWa et al., "Redeye: Analog convnet image sensor architecture for continuous mobile vision," in 2016 ACM/IEEE 43rd Annual International Symposium on Computer Architecture (ISCA), pp. 255-266 (2016).

Lim et al., "Performance comparison of mim capacitors and metal finger capacitors for analog and rf applications," In 2004 RF and Microwave Conference (IEEE Cat. No. 04EX924), pp. 85-89 (2004).

Lin et al., "The architectural implications of autonomous driving: Constraints and acceleration," SIGPLAN Not., 53(2):751-766 (2018).

Lindholm et al., "Nvidia tesla: A unified graphics and computing architecture," IEEE Micro, 28(2):39-55 (2008).

Lu et al., "A 1 tops/w analog deep machine-learning engine with floating-gate storage in 0.13 m cmos," IEEE Journal of Solid-State Circuits, 50(1):270-281 (2015).

Lu et al., "Combined central and subspace clustering for computer vision applications," in Proceedings of the 23rd International Conference on Machine Learning, ser. ICML '06. New York, NY, USA: ACM, pp. 593-600 (2006).

Manem et al., "A read-monitored write circuit for ltlm multi-level memristor memories," in 2011 IEEE International Symposium of Circuits and Systems (ISCAS), pp. 2938-2941 (2011).

McLaren et al., "Generation of accurate on-chip time constants and stable transconductances," IEEE Journal of Solid-State Circuits, 36(4):691-695 (2001).

Mirchandani et al., "CMOS based ultra-low power high-precision analog vector matrix multiplication circuit with 0.1% error for vision application," in 2019 IEEE Midwest Symposium on Circuits and Systems (MWSCAS), pp. 1-4 (2019).

Mirchandani et al., "High stability gain structure and filter realization with less than 50 ppm/oc temperature variation with ultra-low power consumption using switched-capacitor and sub-threshold biasing," in 2018 IEEE International Symposium on Circuits and Systems (ISCAS), pp. 1-4 (2018).

Miyashita et al., "A neuromorphic chip optimized for deep learning and cmos technology with time-domain analog and digital mixed-signal processing," IEEE Journal of Solid-State Circuits, 52(10):2679-2689 (2017).

Mondal et al., "Accurate constant transconductance generation without off-chip components," In 2015 28th International Conference on VLSI Design, pp. 249-253 (2015).

Ng et al., "Medical image segmentation using k-means clustering and improved watershed algorithm," in 2006 IEEE Southwest Symposium on Image Analysis and Interpretation, pp. 61-65 (2006).

Nicolson et al., "Improvements in biasing and compensation of cmos opamps," In 2004 IEEE International Symposium on Circuits and Systems (IEEE Cat. No. 04CH37512), 1:665-668 (2004).

Nikolaos et al., "A novel way to efficiently simulate complex full systems incorporating hardware accelerators," in Proceedings of the Conference on Design, Automation & Test in Europe, ser. Date '17. 3001 Leuven, Belgium, Belgium: European Design and Automation Association, pp. 658-661 (2017).

Park et al., "A 646gops/w multi-classifier many-core processor with cortex-like architecture for superresolution recognition," in 2013 IEEE International Solid-State Circuits Conference Digest of Technical Papers, pp. 168-169 (2013).

Pavan, "A fixed transconductance bias technique for cmos analog integrated circuits," In 2004 IEEE International Symposium on Circuits and Systems (IEEE Cat. No. 04CH37512) 1:661-664 (2004).

Potter et al., "Detecting meaning in rsvp at 13 ms per picture," Attention, Perception, & Psychophysics, 76(2):270-279 (2014).

Razavi,. "Design of Analog CMOS Integrated Circuits," McGraw-Hill, first edition (2001).

Redmon et al., "You only look once: Unified, real-time object detection," 2016 IEEE Conference on Computer Vision and Pattern Recognition (CVPR) (2016).

Ren et al., "Faster r-cnn: Towards real-time object detection with region proposal networks," in Advances in Neural Information Processing Systems 28, C. Cortes, N. D. Lawrence, D. D. Lee, M. Sugiyama, and R. Garnett, Eds. Curran Associates, Inc., pp. 91-99 (2015).

Roberts et al., "26.8 a 236nw-56.5dbm-sensitivity bluetooth low-energy wakeup receiver with energy harvesting in 65nm emos," in 2016 IEEE International SolidState Circuits Conference (ISSCC), pp. 450-451 (2016).

Serrano et al., "A precision low-tc wide-range cmos current reference," IEEE Journal of Solid-State Circuits, 43(2):558-565 (2008).

Shafiee et al., "Isaac: A convolutional neural network accelerator with in-situ analog arithmetic in crossbars," in 2016 ACM/IEEE 43rd Annual International Symposium on Computer Architecture (ISCA), pp. 14-26 (2016).

Shao et al., "Co-designing accelerators and soc interfaces using gem5-aladdin," in 2016 49th Annual IEEE/ACM International Symposium on Microarchitecture (MICRO), pp. 1-12 (2016).

Shen et al., "Constant-gm bias circuit without off-chip components," In 2016 13th IEEE International Conference on Solid-State and Integrated Circuit Technology (ICSICT), pp. 1309-1311 (2016).

Shi et al., "Edge computing: Vision and challenges," IEEE Internet of Things Journal, 3(5):637-646 (2016).

Shrivastava et al., "5.4 a 32nw bandgap reference voltage operational from 0.5v supply for ultra-low power systems," in 2015 IEEE International Solid-State Circuits Conference—(ISSCC) Digest of Technical Papers, pp. 1-3 (2015).

Shrivastava et al., "A 1.5 nw, 32.768 khz xtal oscillator operational from a 0.3 v supply," IEEE Journal of Solid-State Circuits, 51(3):686-696 (2016).

Shrivastava et al., "A 10mv-input boost converter with inductor peak current control and zero detection for thermoelectric energy harvesting," in Proceedings of the IEEE 2014 Custom Integrated Circuits Conference, pp. 1-4 (2014).

Shrivastava et al., "A charge pump based receiver circuit for voltage scaled interconnect," in Proceedings of the 2012 ACM/IEEE International Symposium on Low Power Electronics and Design, ser. ISLPED '12. New York, NY, USA: ACM, pp. 327-332 (2012).

Simonyan et al., "Very deep convolutional networks for large-scale image recognition," CoRR, vol. abs/1409.1556 (2014).

Steininger, "Understanding wide-band mos transistors," IEEE Circuits and Devices Magazine, 6(3):26-31 (1990).

Strukov et al., "The missing memristor found," Nature, 453:80-83 (2008).

Szegedy et al., "Going deeper with convolutions," CoRR, vol. abs/1409.4842 (2014).

Talebbeydokhti et al., "Constant transconductance bias circuit with an on-chip resistor," 2006 IEEE International Symposium on Circuits and Systems, pp. 2857-2860 (2006).

(56) References Cited

OTHER PUBLICATIONS

Vietze et al., "Image sensing with programmable offset pixels for increased dynamic range of more than 150 db," Proc. of SPIE, 2654:2654-2656 (1996).
Wu et al., "Multiplication on the edge," Nature Electronics, 1:8-9 (2018).
Yu et al., "A high-density mim capacitor (13 ff/m2) using ald hfo2dielectrics," IEEE Electron Device Letters, 24(2):63-65 (2003).
Zeiler et al., "Visualizing and understanding convolutional networks," CoRR, vol. abs/1311.2901 (2013).
Zele et al., "Low-power cmos continuous-time filters," IEEE Journal of Solid-State Circuits, 31(2):157-168 (1996).
Zhang et al., "18.4 a matrix-multiplying adc implementing a machine-learning classifier directly with data conversion," in 2015 IEEE International Solid-State Circuits Conference—(ISSCC) Digest of Technical Papers, pp. 1-3 (2015).
Zhang et al., "A batteryless 19 mw mics/ism-band energy harvesting body sensor node soc for exg applications," IEEE Journal of Solid-State Circuits, 48(1):199-213 (2013).
Fridman, "Tesla Vehicle Deliveries and Autopilot Mileage Statistics," retreived online at <https://lexfridman.com/tesla-autopilot-miles-and-vehicles/>: 4 pages (2019).
Liu et al., "BSIM3v3. 3 MOSFET model users' manual": 203 pages (2005).

* cited by examiner

| Ref | [16] | | [15] | [9] | [14] | [10] | This Work | | |
|---|---|---|---|---|---|---|---|---|---|
| Implementation | $g_m$ | BPF | 2nd order biquad | $g_m$ | 3rd order BPF | $g_m$ | OTA | Diff Amp | Biquad |
| CMOS Process (nm) | 150 | 150 | 500 | 180 | 180 | 180 | 130 | 130 | 130 |
| Temp. Range (°C) | -40 to 125 | -40 to 125 | -30 to 110 | 20 to 80 | -40 to 100 | 25 to 100 | 0 to 120 | 0 to 120 | 0 to 120 |
| TC (ppm/°C) | 76 | 36 ($f_0$) | 71.4 | 500 | 166 | 186 | 54.5 | 48.6 | 69 |
| Voltage Range | 10% | N.R. | 11-17 | 20% | N.R. | N.A. | 25% | 25% | 25% |
| Supply var (%) | 1.6% | N.R. | N.R. | 1% | N.R. | N.A. | 0.85% | 1.27% | 1.5% |
| Filter 3dB freq (kHz) | N.A. | N.R. | 0.012 | N.A. | 2000 | N.A. | N.A. | N.A. | 22.7 |
| Process (%) | 1.4% | N.R. | N.R. | N.R. | 3.6% | 4% | 3.93% † | 2.57% † | 4.2% † |
| Power (bias circuit) | < 9 nW ‡ | | 55.3 nW ² | 850 µW | 22.4 µW | 37.8 µW | 19.2 nW | | |

† 3σ variation  
‡ $g_m$ block  
² $g_m$ (bias circuit)

FIG. 8

HIGH STABILITY GAIN STRUCTURE AND FILTER REALIZATION WITH LESS THAN 50 PPM/° C. TEMPERATURE VARIATION WITH ULTRA-LOW POWER CONSUMPTION USING SWITCHED-CAPACITOR AND SUB-THRESHOLD BIASING

CROSS REFERENCE TO RELATED APPLICATION

This application claims priority from U.S. Provisional Patent Application No. 62/823,334 filed on Mar. 25, 2019 and entitled METHODS FOR GENERATING HIGH STABILITY GAIN STRUCTURE AND FILTERS IN INTEGRATED CIRCUITS, which is hereby incorporated by reference.

BACKGROUND

Internet-of-Things (IoT) envisions a large scale deployment of ultra-low power (ULP) electronic devices integrated in our environment to perform meaningful sensing and communication. However, existing IoT devices have lower available power and can perform only a limited amount of sensing, processing, and communication, of which communication has the highest power consumption. To reduce the power consumption needed for communication, the amount of data must be reduced, which can be done by incorporating computing at the edge in IoT [1].

A few recently published IoT devices achieve micro-watt level power consumption [2]. However, system power consumption and area remains high for applications needing miniaturized devices while operating from harvested energy. Analog computing and processing can achieve both lower power and lower area. Gain structures such as differential amplifiers, op-amps, filters, etc. are the fundamental building blocks of an analog computer. However, these circuit elements suffer from inaccuracies and drifts due to process, voltage, and temperature (PVT) variations.

Transconductance, $g_m$ of a current biased transistor or a differential pair is a key parameter that impacts the gain, bandwidth, and other critical parameters in analog circuits. A transistor biased with a current source is typically used to generate $g_m$. A constant $g_m$ can be generated by using the current biases generated using the circuits shown in FIG. 1A and FIG. 1B. A transistor is biased such that its $g_m$ is inversely proportional to a precise resistor $R_X$ as shown in FIG. 1A ([3], [4]). However, this approach requires precise off-chip resistors to make $g_m$ immune to process variations, which leads to large area and cost overhead. Also, these circuits are based on the square law model of MOSFETs, which is not accurate for modern-day short channel devices. In [5], authors introduce a novel circuit to address the supply variation, but require an off-chip resistor. Off-chip implementation of resistance gives rise to large parasitic capacitance $C_P$ in parallel with $R_X$. This forms a pole-zero pair at low frequencies which can cause the system to become unstable [6]. Hence, a large compensation capacitor is needed to ensure stability of the constant $g_m$ circuit.

Several on-chip solutions have been presented in recent years where the resistor in the conventional circuit is replaced with a transistor operating in triode region [7]-[10]. In [7], the MOSFET is biased in the linear region with current and voltage references to track the $g_m$ of a transistor. However, the circuit suffers from high power consumption in the μWs range. The work in [8] also uses a voltage reference to bias the linear region transistor but has a high temperature coefficient. [10] uses a PT invariant current source to bias a transistor at the voltage where its on-resistance is invariant to temperature. [9] uses a master-slave topology to tune the on-chip resistor to its desired value. A switched capacitor network is used as the reference resistor which controls the biasing of the MOS in triode region via a feedback loop. The on-chip resistor can also be tuned via a PLL locked to a frequency reference. In [11], a precise crystal oscillator for precise tuning of the resistor is used to realize a constant $g_m$ circuit. In [12], the author presents a differential pair in which the tail current is adjusted by a feedback loop such that $g_m$ of the input transistors is proportional to 1/R. Although this circuit does not depend on the square law of the MOSFET, it requires an external resistor. [13] also proposes using an external resistor to obtain constant $g_m$ bias based on analog computation technique. [14] describes a complementary constant $g_m$ biasing scheme of Nauta transconductors for $g_m$—C filter applications. Here, the conventional beta-multiplier circuit is modified to include a PMOS transistor to provide a voltage bias. The resistor is trimmed to account for process and temperature variations. Also, the beta multiplier circuits work on the square law assumption, which is inaccurate for short channel transistors or for ultra-low power sub-threshold operation.

Various embodiments disclosed herein relate to a constant $g_m$ bias circuit operating in the sub-threshold region for low power consumption. Although sub-threshold operation can achieve very low power consumption, it is traditionally associated with PVT variations. However, stable and precise outputs for various fundamental analog circuits can be obtained using sub-$V_{th}$ operation ([15], [16]). In the present application, the resistor in a traditional current source is replaced with a switched capacitor resistor (SCR). This biasing scheme is then used for the biasing of a differential amplifier and a second order biquad filter to demonstrate proof of concept. This biasing configuration was initially theorized for biasing saturation region MOS transistors in [17], but was considered impractical by [18] due to ripple and other second order effects. However, this technique has merit in sub-threshold operation where low frequency operation is desired for ULP operation. This application discloses sub-threshold biasing and shows that the ripple of this circuit can be minimized and a very precise realization of filter and gain structure can be achieved whose stability can be compared to conventional bandgap reference voltage. Simulation results show that we can achieve a temperature stability of 48.6 ppm/° C. for gain of a single stage differential amplifier realization. Similar biasing circuit is also used to implement a second order filter circuit, which achieved a temperature stability of 69 ppm/° C.

BRIEF SUMMARY OF THE DISCLOSURE

Various embodiments disclosed herein relate to an ultra-low power sub-threshold $g_m$ stage where transconductance is very stable with process, temperature, and voltage variations. This technique can be implemented, e.g., in a differential amplifier with constant gain and a second order biquad filter with constant cut off frequency. The amplifier gain can achieve a small temperature coefficient of 48.6 ppm/° C. and exhibits small sigma of 75 mdB with process. The second order biquad can achieve temperature stability of 69 ppm/° C. and a voltage coefficient of only 49 ppm/mV.

A method in accordance with one or more embodiments comprises generating a biasing current ($I_0$) using a constant gm bias circuit operating in the subthreshold region for ultra-low power consumption. The circuit includes a switched capacitor resistor having a first capacitor, wherein the biasing current ($I_0$) is given by: $I_0 = V_T \ln(M)/R_1$, where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1C_1$, where $C_1$ is a capacitance of the first capacitor, and $f_1$ is a frequency of a reference clock of the constant gm bias circuit.

A differential amplifier circuit in accordance with one or more embodiments includes a constant gm bias circuit operating in the subthreshold region for ultra-low power consumption generating a biasing current ($I_0$), said constant gm bias circuit including a switched capacitor resistor having a first capacitor, wherein the biasing current ($I_0$) is given by: $I_0 = V_T \ln(M)/R_1$, where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1C_1$, $C_1$ is a capacitance of the first capacitor, and $f_1$ is a frequency of a reference clock of the constant gm bias circuit. A differential amplifier is biased with the biasing current, the differential amplifier including a load switched capacitor resistor having a second capacitor, wherein the differential amplifier has constant gain ($A_v$) given by: $A_v = \ln(M) f_1 C_1 / \eta f_3 C_3$, where $\eta$ is a process constant value for the differential amplifier, $C_3$ is a capacitance of the second capacitor, and $f_3$ is a frequency of the load switched capacitor resistor of the differential amplifier.

A second-order biquad filter in accordance with one or more embodiments includes a constant gm bias circuit operating in the subthreshold region for ultra-low power consumption generating a biasing current ($I_0$). The constant gm bias circuit includes a switched capacitor resistor having a first capacitor, wherein the biasing current ($I_0$) is given by: $I_0 = V_T \ln(M)/R_1$, where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1C_1$, where $C_1$ is a capacitance of the first capacitor, and $f_1$ is a frequency of a reference clock of the constant gm bias circuit. A second order biquad filter is biased with the biasing current to obtain a stable cut-off frequency.

BRIEF DESCRIPTION OF THE DRAWINGS

FIG. 8 is a table showing performance comparisons between known constant gm bias circuits and exemplary circuits in accordance with various embodiments.

DETAILED DESCRIPTION

Precision Analog Gain Structure and Filter Implementation

The transconductance, $g_m$ of a transistor in sub-threshold is given by $$g_m = \frac{I_D}{\eta V_T} \quad (1)$$

where $I_D$ is the bias current, $\eta$ is a process constant, and $V_T$ is the thermal voltage. The transconductance is inversely proportional to temperature. If the transistor is biased with a current source that is proportional to absolute temperature (PTAT), then a constant $g_m$ can be obtained as $$g_m = \frac{I_{PTAT}}{\eta V_T} \quad (2)$$

Figure 1A:
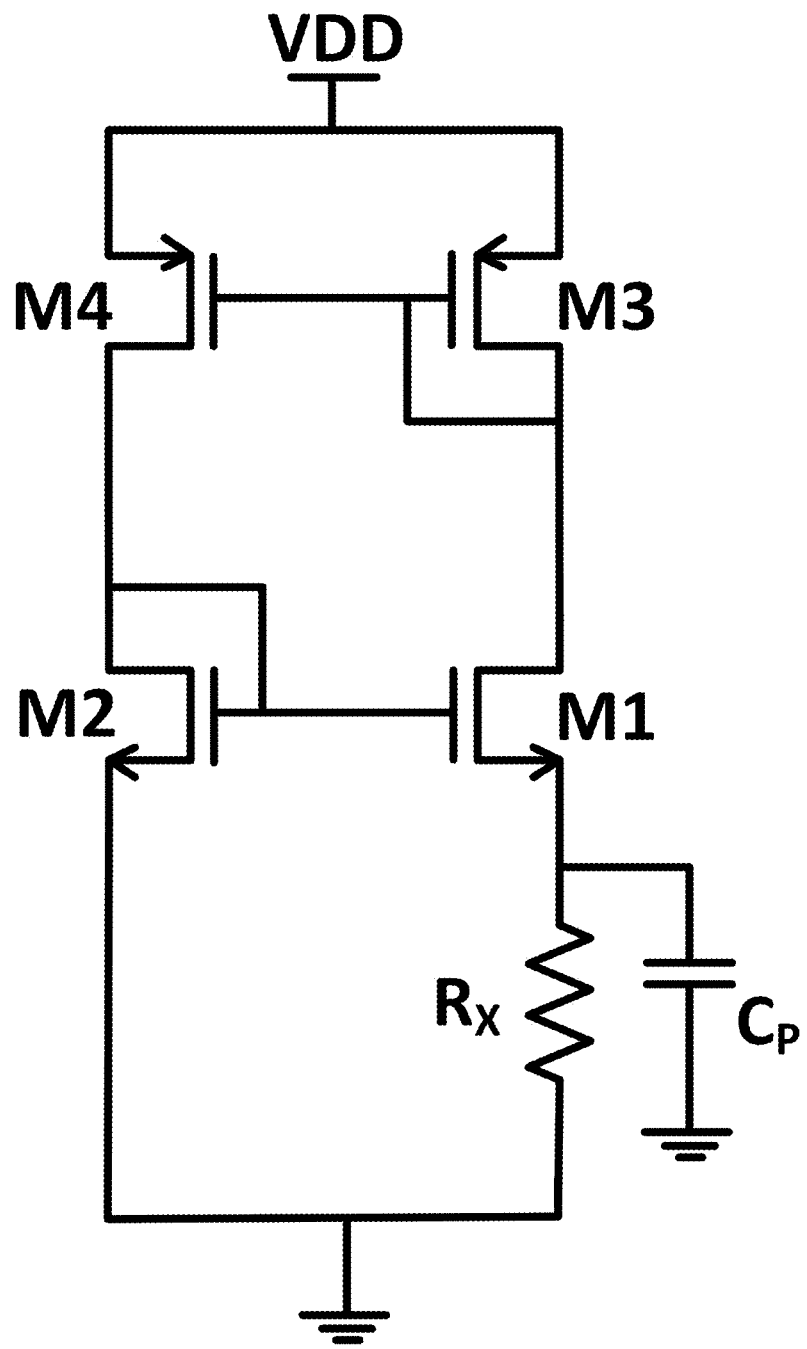
FIG. 1A shows an exemplary conventional MOS-based current source for constant gm biasing.
Figure 1B:
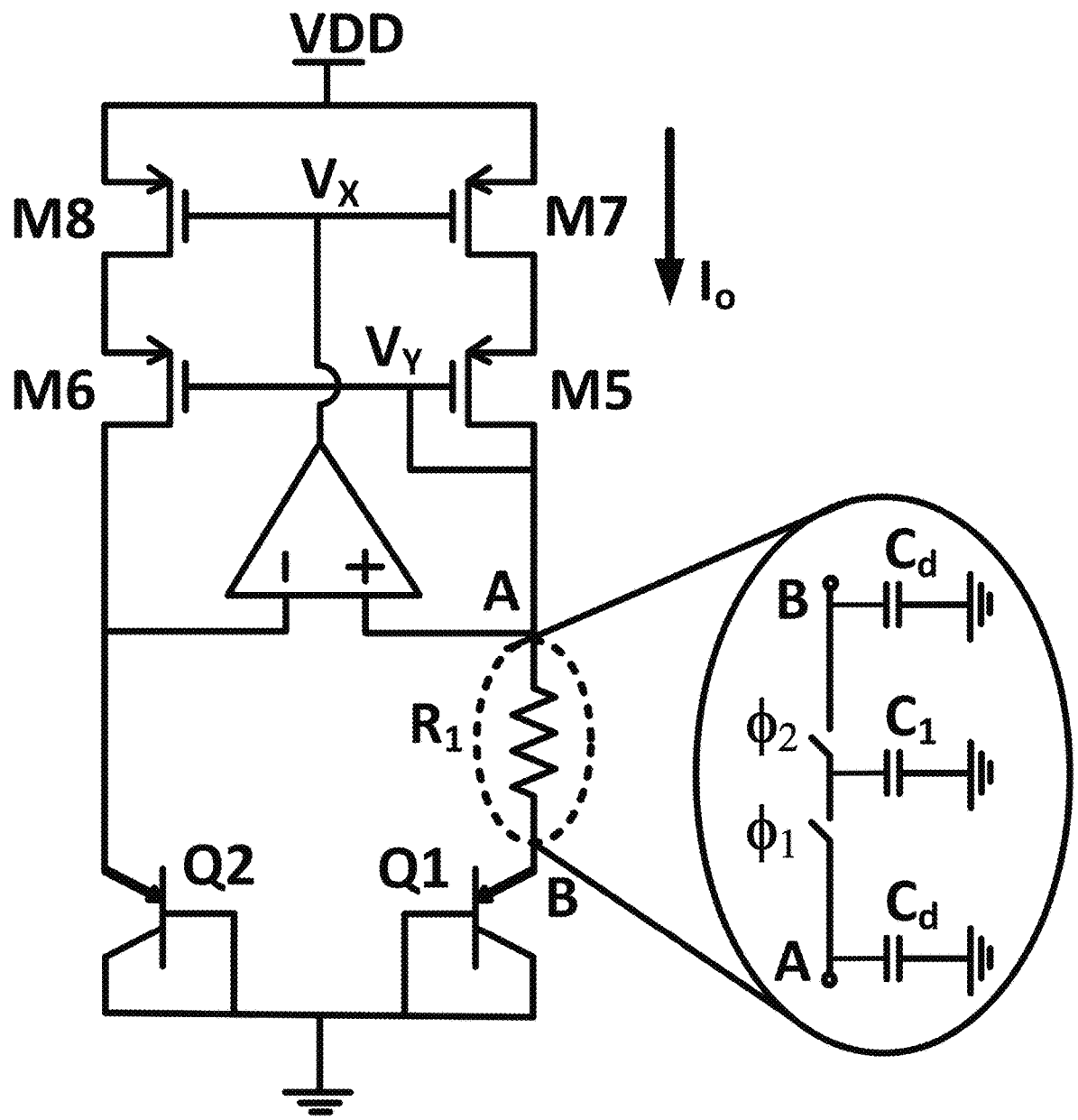
FIG. 1B shows an exemplary BJT-based current source for constant gm biasing.

PTAT current is obtained using the conventional BJT based current source with a resistor $R_1$ shown in FIG. 1B, where $Q_1$ has M times the area of $Q_2$.

$$I_0 = V_T \ln(M)/R_1 \quad (3)$$

where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1C_1$, $C_1$ is a capacitance of the first capacitor, and $f_1$ is a frequency of a reference clock of the constant gm bias circuit.

When $I_o$ is used to bias a transistor in sub-threshold, its transconductance can be calculated using Eq. (2) and (3) as $$g_m = \ln(M)/\eta R_1 \quad (4)$$

which has a lower variation as it only depends on $R_1$.

The conventional MOS-based current source shown in FIG. 1A can also be biased in the sub-threshold region to obtain a PTAT current. This is because the current through a MOS biased in sub-threshold region is, $$I_{DS} = I_{S0} \exp\left(\frac{V_{GS} - V_{th} - V_{off}}{\eta V_T}\right)\left(1 - \exp\left(-\frac{V_{DS}}{V_T}\right)\right) \quad (5)$$

where $I_{S0}$ is the sub-threshold saturation current and $V_{off}$ is the offset voltage as discussed in [19] and [20]. The current characteristic is exponential, similar to that of a BJT. However, we use BJTs for a more precise operation. Assuming $V_{DS}>3$ $V_T$ in a circuit configuration shown in FIG. 1A which is biased in sub-threshold, the offset $V_{off}$ in equation (5) gives rise to the following current $$I_o = \frac{V_T \ln(K)}{R} + const \quad (6)$$

The constant term, const, is independent of temperature, which makes transconductance vary with temperature. A BJT based PTAT current source does not suffer from this issue and provides better stability.

Resistor implementation is susceptible to process and temperature variations. Also, for small current generation in the nAs range, a very large resistor is needed, which can be difficult to implement. These challenges are overcome by replacing the resistor with a switched capacitor implementation. The SCR implementation is achieved by using MIM cap and a reference frequency clock. MIM caps have a small temperature coefficient of 35 ppm/° C. [21] and small process variations. Also, the stable frequency reference which is used for SCR network is a fundamental component in most systems. It has a stability of less than 3-5 ppm/° C. and can operate with a power consumption of 1-2 nW [22]. Since large resistors in the range of Mega-Ω s are required to generate small current for sub-threshold biasing, the area of the switched capacitor design can be much lower than the resistor based design while providing high degree of accuracy. Also, since the same bias circuit is used to bias several other circuits on the chip, the overhead is not large.

The resistance of the SCR is given by $$R = \frac{1}{f_1 C_1} \quad (7)$$

where $f_1$ is the frequency of the reference clock and $C_1$ is the capacitor.

From Eq. (4) and (7), transconductance is now given by $$g_m = \ln(M) f_1 C_1 / \eta \quad (8)$$

Eq. 8 shows that $g_m$ is now a function of capacitor and reference frequency. Decoupling capacitors ($C_d$) of 8 pF are added at nodes A and B in FIG. 1B to suppress the ripple originating from the SCR and also to ensure that the resistance of the network remains constant with temperature. Since nodes $V_X$ and $V_Y$ are used to bias other circuits, RC filters are used to filter out the ripple. The filter needed for ripple suppression can be implemented using transistors (FIG. 2A) or with active filters to save area. The op-amp in the current source also helps in filtering out ripple at $V_X$ as it is designed to have small bandwidth.

One source of temperature instability in an SCR based circuit can manifest from the charge injection through the gates of SCR circuits. We use small size switches with dummy switches for charge injection cancellation for better stability with temperature and voltage.

Differential Amplifier

Figure 2B:
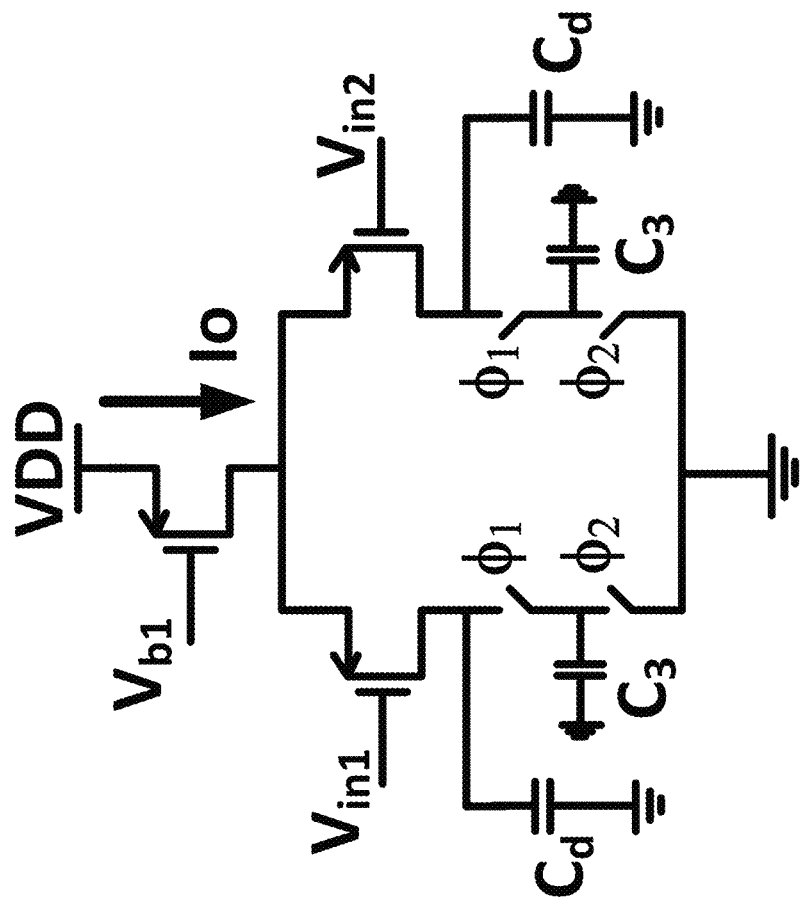
FIG. 2B shows an exemplary differential amplifier with an SCR and decoupling capacitors in accordance with one or more embodiments.
Figure 2A:
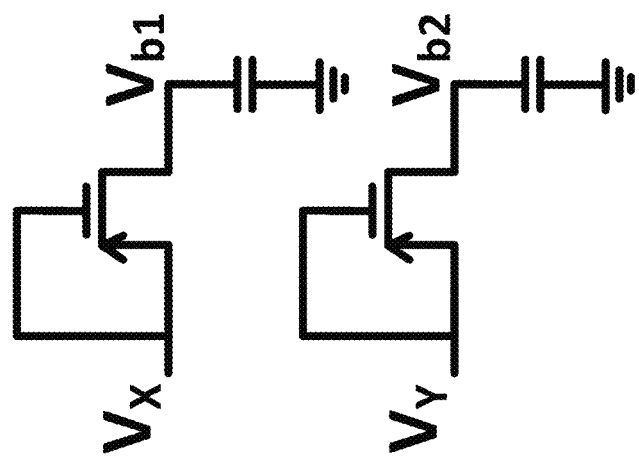
FIG. 2A shows an exemplary RC filter for ripple suppression implemented using transistors.

An exemplary single stage differential amplifier with resistive loads in accordance with one or more embodiments depicted in FIG. 2B is biased with the described constant $g_m$ biasing scheme. For low power consumption, the amplifier is designed in the sub-threshold region and is biased with 50 nA current. The gain $A_V$ of the amplifier is given by, $$A_v = g_m R_D \quad (9)$$

where $R_D$ is the load resistor. A gain of 20 dB with this single stage amplifier requires large resistors of ~18 MΩ at the load to obtain an output common mode level of 500 mV. Here, the large resistors are replaced with switched capacitor resistors to achieve the same gain (FIG. 2B). The differential amplifier was designed with both a poly-resistor and SCR with 600 fF flying capacitor, and 3 pF decoupling capacitors to estimate area. The area of the poly-resistor amplifier was 1.3× higher area than the SCR implementation. Even lower area and lower power solution can be envisioned with SCR. The gain with SCR load is given by $$A_v = \ln(M) f_1 C_1 / \eta f_3 C_3 \quad (10)$$

where $f_3$ is the frequency of the load SCR of the amplifier.

Figure 3:
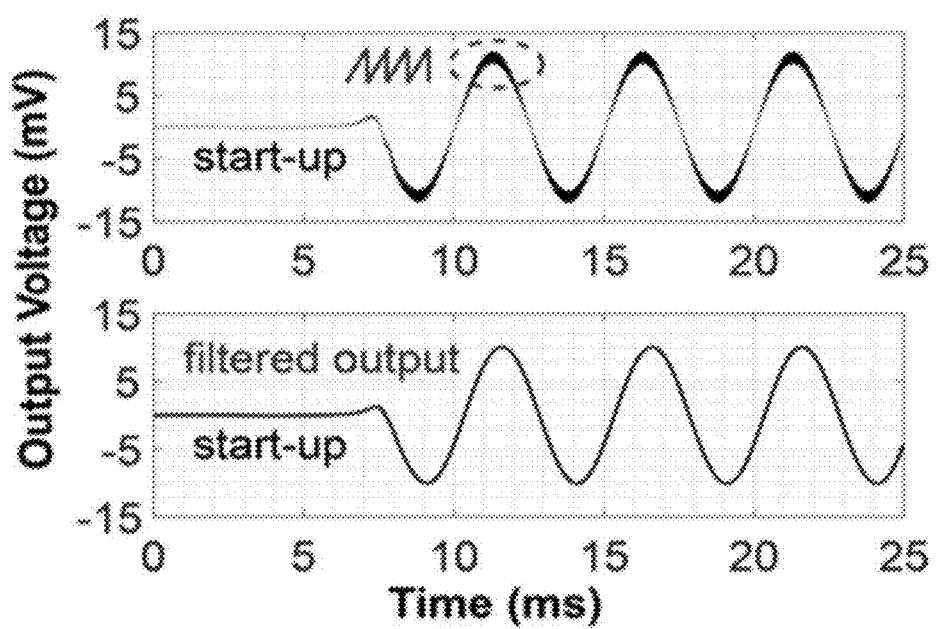
FIG. 3 shows amplifier output before and after filtering with an ideal filter.
Figure 4B:
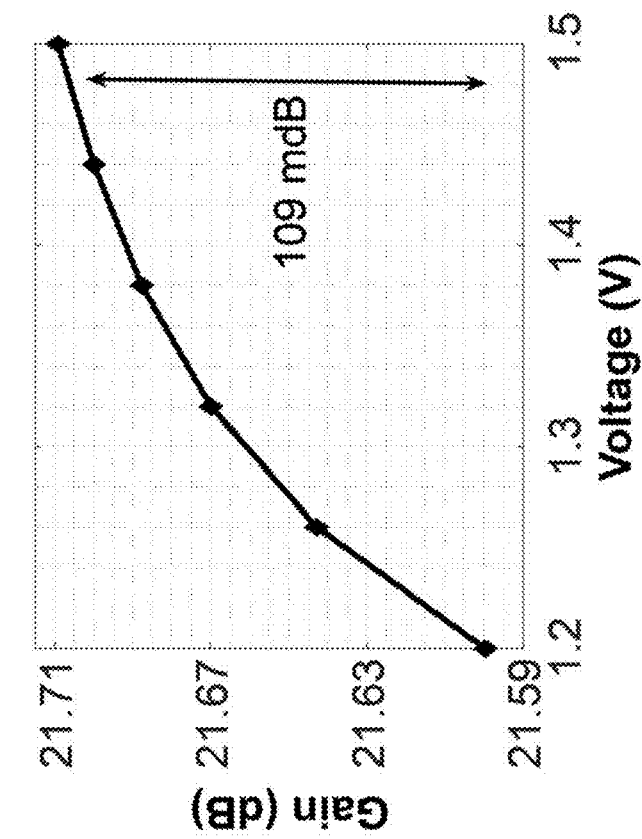
FIGS. 4A and 4B show differential amplifier gain variance with temperature and voltage, respectively.
Figure 4A:
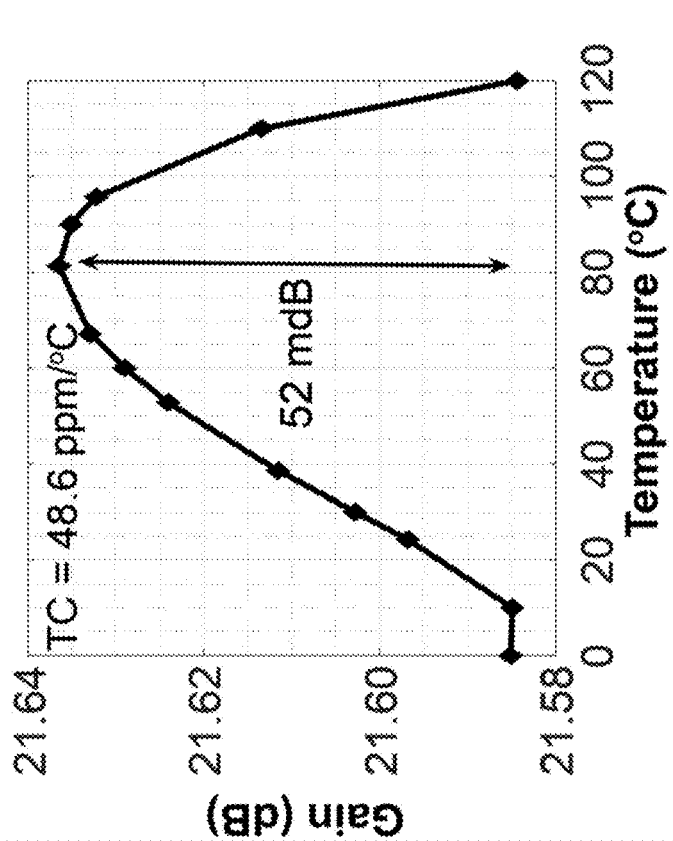
Figure 5B:
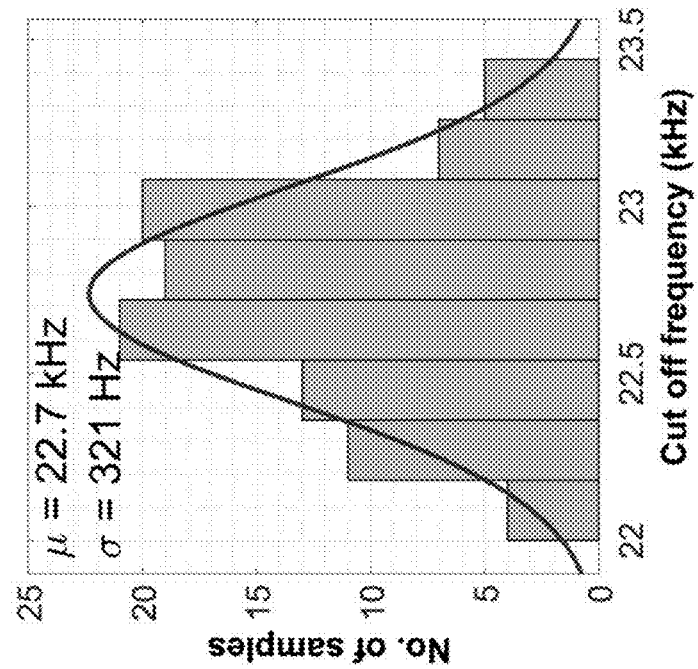
FIG. 5B shows process variation of cut off frequency of a biquad filter.
Figure 5A:
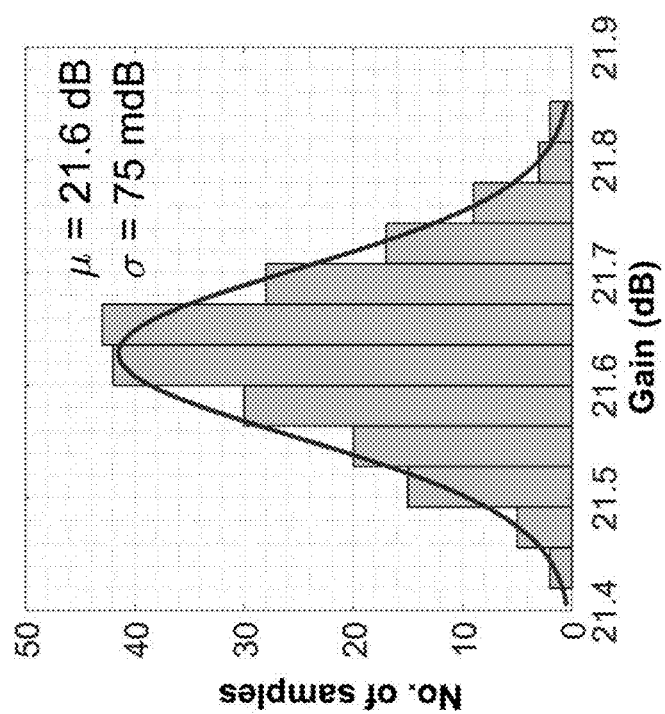
FIG. 5A shows process variation of differential amplifier gain at 50□.

Small flying capacitor and high frequency of 90 kHz is used to emulate the load resistor. This is to ensure that the ripple frequency from the load SCR falls outside the bandwidth of the amplifier. The small ripple introduced by the SCR can be filtered out using a filter (FIG. 3). Also, the frequency for the load SCR can be generated from the reference clock on the chip. From eq. (10), it is clear that gain is constant and the only process dependent parameter is η. Capacitors show little variation with process, and are in a ratio that is reliable even with variations. FIGS. 4A and 4B show the temperature and voltage variation of the amplifier gain, and FIG. 5A shows variation with process. The amplifier gain (in V/V) has a temperature coefficient of less than 50 ppm/° C., and varies by 1.27% for a 25% increase in supply.

Second Order Filter

Figure 2C:
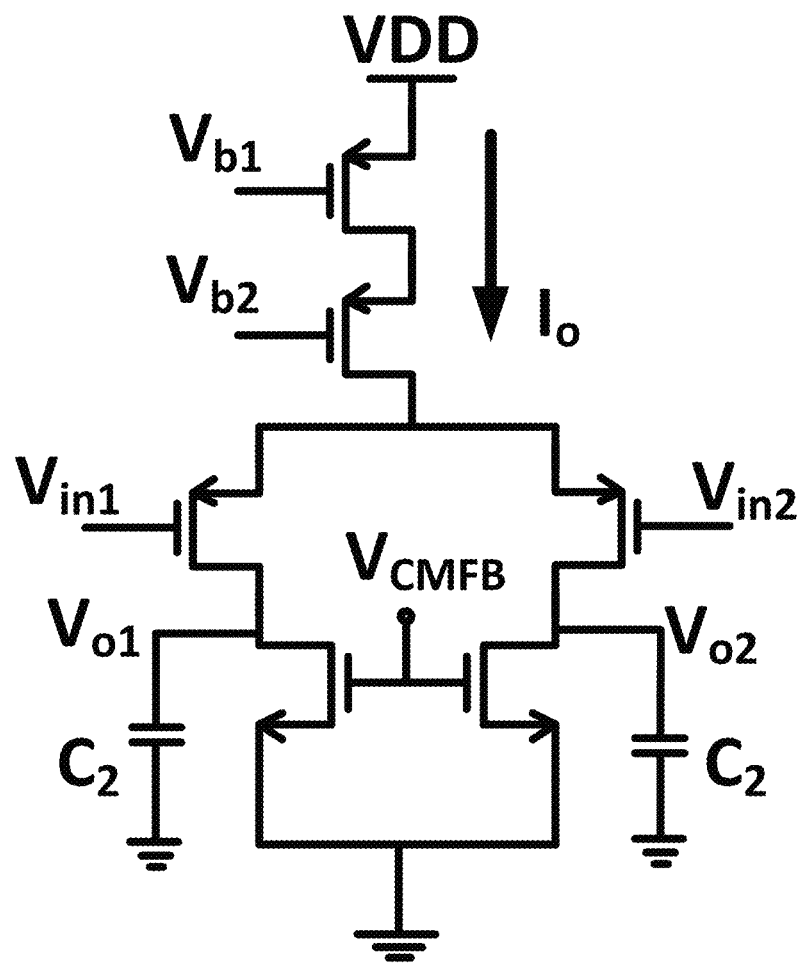
FIG. 2C shows an exemplary operational transconductance amplifier (OTA) in accordance with one or more embodiments.
Figure 2D:
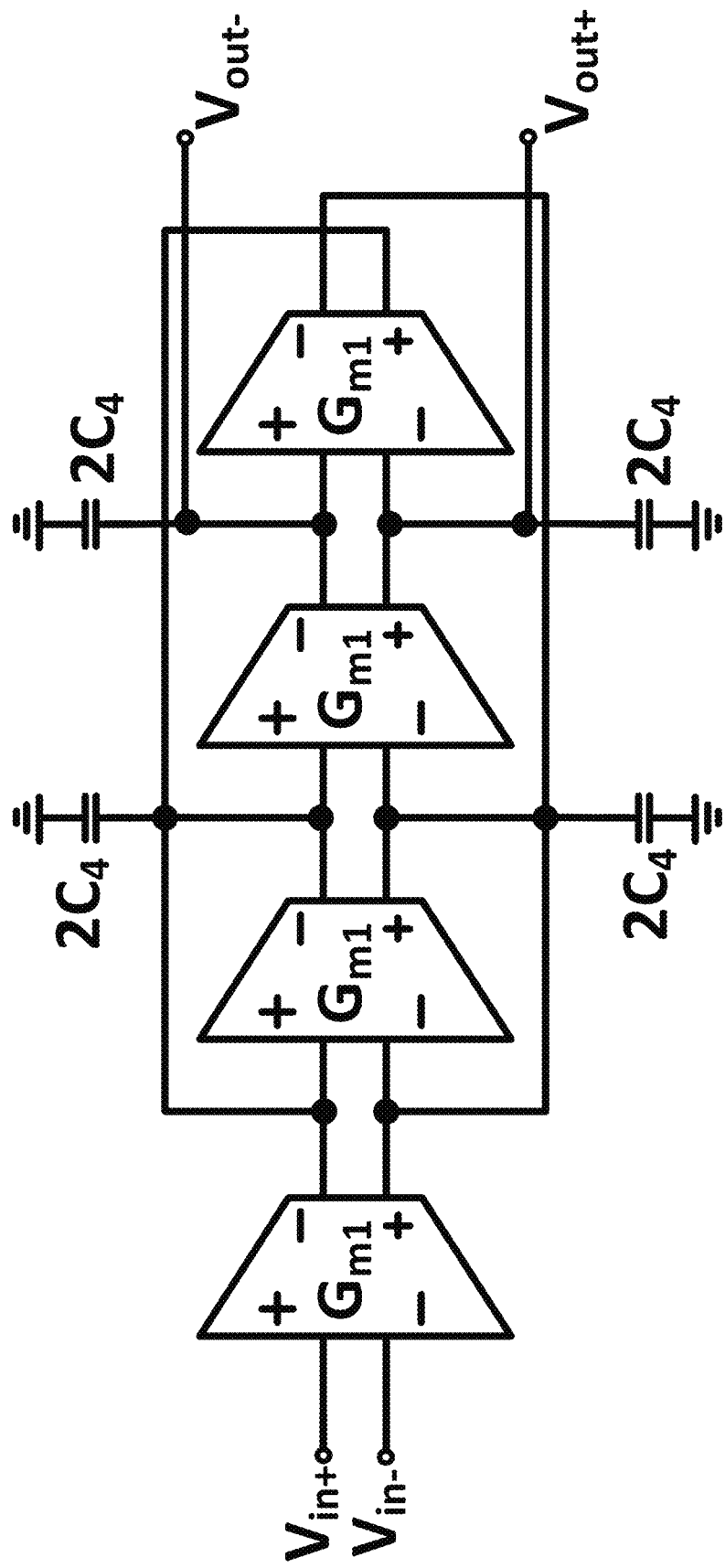
FIG. 2D shows an exemplary second order biquad filter in accordance with one or more embodiments.

An exemplary second order biquad filter in accordance with one or more embodiments shown in FIG. 2D is biased with the constant $g_m$ biasing circuit to obtain stable cut-off frequency. The filter includes four identical operational transconductance amplifiers (OTAs) (FIG. 2C) biased with sub-threshold PTAT current, whose unity gain frequency is given by $$UGF = \frac{g_m}{C_2} \quad (11)$$

From Eq (8) and (11)

$$UGF = \ln(M) f_1 C_1 / \eta C_2 \quad (12)$$

Figure 7B:
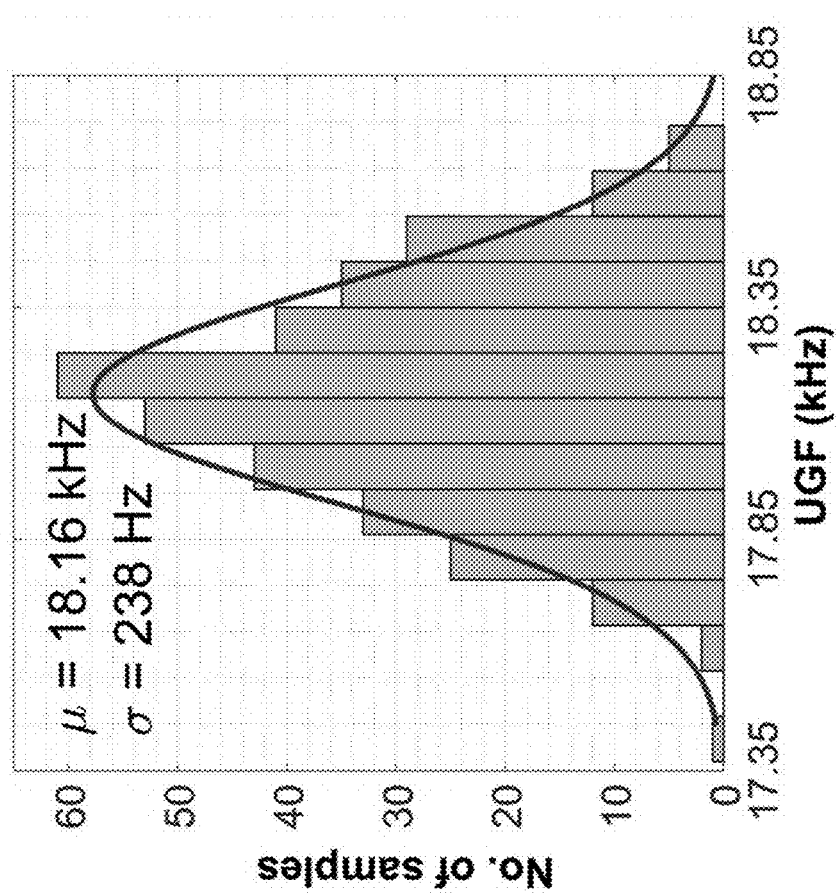
FIGS. 7A and 7B show variation of unity gain frequency of OTA with temperature and process, respectively.
Figure 7A:
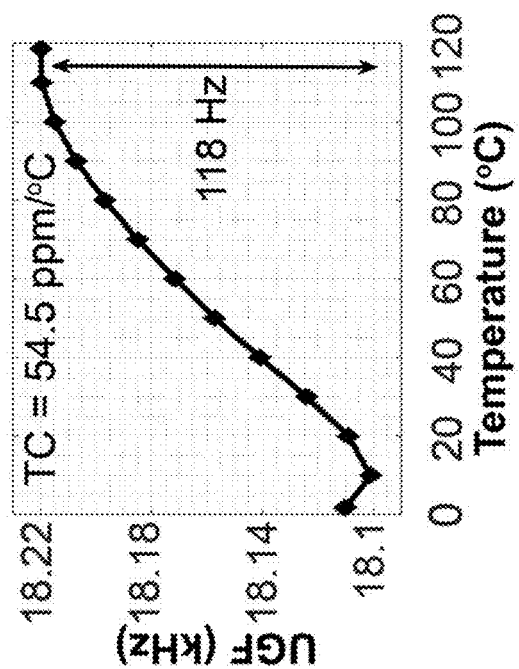

Eq. (12) shows that the UGF is now completely dependent on the ratio of $C_1$ and $C_2$ which implies that it is only dependent on reference clock frequency and η to achieve a very high stability. Variation of UGF with temperature is shown in FIG. 7A, which is less than 0.7%. The cut-off frequency of the biquad filter shown in FIG. 2D is given by ([23]), $$(\omega_o)^2 = \frac{g_{m3} g_{m4}}{(C_4)^2} \quad (13)$$

Hence, replacing transconductance by Eq. (8), and assuming all transconductances are equal, $$Wo = \ln(M) f_1 C_1 / \eta C_4 \quad (14)$$

Figure 6B:
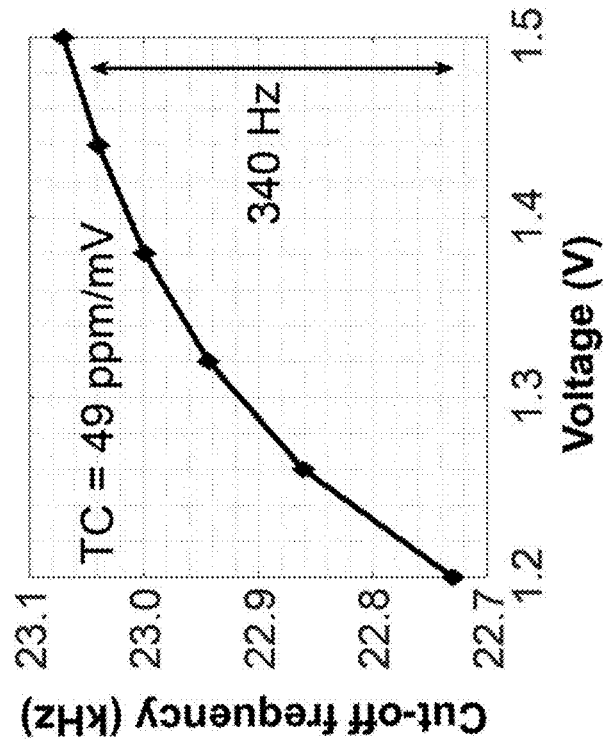
FIGS. 6A and 6B show variation of cut off frequency of a biquad LPF with temperature and supply voltage, respectively.
Figure 6A:
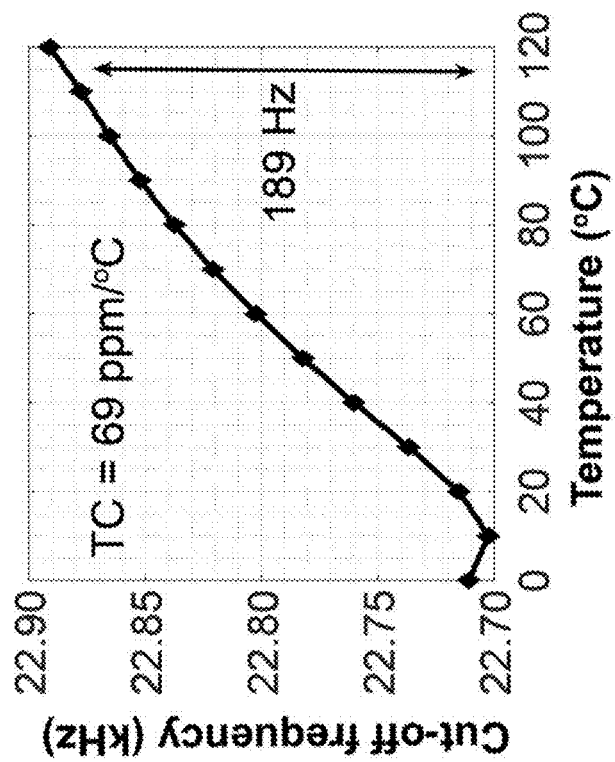

The cut off frequency is independent of temperature and supply as shown in FIG. 6A and FIG. 6B. The temperature and voltage coefficients of the filter are found to be 69 ppm/° C. and 49 ppm/mV respectively. Table I shown in FIG. 8 compares our work with prior-works. The work in [16]

shows better stability than our work but relies on an external voltage source to fine-tune the PTAT current source. The work in [15] also uses sub-threshold biasing to realize high stability but can only achieve lower bandwidth of 12 Hz. Our work achieves higher performance and reduces the power consume when compared to a more related recent prior art [9]. We also report a very wide temperature range of operation of 0-120° C. when compared to [14] and [10].

In summary, the present application discloses a methodology for constant $g_m$ biasing where the circuits are biased in sub-threshold region with a proportional to absolute temperature current to obtain constant transconductance which is highly stable with temperature, supply and process variations. A differential amplifier with constant gain, and a second order biquad filter with constant cut off frequency disclosed demonstrate proof of concept. The differential amplifier achieves 49 ppm/° C. temperature coefficient for the gain, which varies by 1.27% with a 25% increase in supply. Simulations also show that the with a temperature coefficient of 69 ppm/° C.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

REFERENCES

[1] W. Shi, J. Cao, Q. Zhang, Y. Li, and L. Xu. Edge computing: Vision and challenges. IEEE Internet of Things Journal, 3(5):637-646, October 2016.

[2] A. Klinefelter, N. E. Roberts, Y. Shakhsheer, P. Gonzalez, A. Shrivastava, A. Roy, K. Craig, M. Faisal, J. Boley, S. Oh, Y. Zhang, D. Akella, D. D. Wentzloff, and B. H. Calhoun. 21.3 a 6.45 µw self-powered iot soc with integrated energy-harvesting power management and ulp asymmetric radios. In 2015 IEEE International Solid-State Circuits Conference-(ISSCC) Digest of Technical Papers, pages 1-3, February 2015.

[3] J. M. Steininger. Understanding wide-band mos transistors. IEEE Circuits and Devices Magazine, 6(3):26-31, May 1990.

[4] R. H. Zele and D. J. Allstot. Low-power cmos continuous-time filters. IEEE Journal of Solid-State Circuits, 31(2):157-168, February 1996.

[5] Jiwei Chen and Bingxue Shi. Novel constant transconductance references and the comparisons with the traditional approach. In Southwest Symposium on Mixed-Signal Design, 2003, pages 104-107, February 2003.

[6] S. Nicolson and Khoman Phang. Improvements in biasing and compensation of cmos opamps. In 2004 IEEE International Symposium on Circuits and Systems (IEEE Cat. No. 04CH37512), volume 1, pages I-665-8 Vol. 1, May 2004.

[7] I. Mondal and N. Krishnapura. Accurate constant transconductance generation without off-chip components. In 2015 28th International Conference on VLSI Design, pages 249-253, January 2015.

[8] Yongjian Shen and Ran Zhang. Constant-gm bias circuit without off-chip components. In 2016 13th IEEE International Conference on Solid-State and Integrated Circuit Technology (ICSICT), pages 1309-1311, October 2016.

[9] N. Talebbeydokhti, P. K. Hanumolu, P. Kurahashi, and Un-Ku Moon. Constant transconductance bias circuit with an on-chip resistor, 2006 IEEE International Symposium on Circuits and Systems, pages 2857-2860, May 2006.

[10] A. Amaravati, M. Dave, M. S. Baghini, and D. K. Sharma. A fully on-chip pt-invariant transconductor. IEEE Transactions on Very Large Scale Integration (VLSI) Systems, 23(9):1961-1964, September 2015.

[11] A. McLaren and K. Martin. Generation of accurate on-chip time constants and stable transconductances. IEEE Journal of Solid-State Circuits, 36(4):691-695, April 2001.

[12] Shanthi Pavan. A fixed transconductance bias technique for cmos analog integrated circuits. In 2004 IEEE International Symposium on Circuits and Systems (IEEE Cat. No. 04CH37512), volume 1, pages 661-4 Vol. 1, May 2004.

[13] C. Y. Chu and Y. J. Wang. A pvt-independent constant-$g_m$ bias technique based on analog computation. IEEE Transactions on Circuits and Systems II: Express Briefs, 61(10):768-772, October 2014.

[14] R. J. E. Jansen, J. Haanstra, and D. Sillars. Complementary constant-$g_m$ biasing of nauta-transconductors in low-power $g_m$ x2013; c filters to x00b1; 2 IEEE Journal of Solid-State Circuits, 48(7):1585-1594, July 2013.

[15] V. Agarwal and S. Sonkusale. A pvt independent subthreshold constant-gm stage for very low frequency applications. In 2008 IEEE International Symposium on Circuits and Systems, pages 2909-2912, May 2008.

[16] U. A. Antao, J. C. M. Hsieh, and T. W. Berger. A 9-nw on-chip constant subthreshold cmos transconductance bias with fine-tuning. In 2017 IEEE International Symposium on Circuits and Systems (ISCAS), pages 1-4, May 2017.

[17] Behzad Razavi. Design of Analog CMOS Integrated Circuits. McGraw-Hill, first edition, 2001.

[18] B. R. Gregoire and U. K. Moon. A sub 1-v constant gm ndash; c switched-capacitor current source. IEEE Transactions on Circuits and Systems II: Express Briefs, 54(3): 222-226, March 2007.

[19] M. C. Jeng. Design and Modeling of Deep-Submicrometer MOSFETs. PhD thesis, University of California, 1989.

[20] Jin Xiaodong Weidong, Liu and Xi Xuemei. BSIM3v3. 3 MOSFET model users' manual, 2005.

[21] Q. S. I. Lim, A. V. Kordesch, and R. A. Keating. Performance comparison of mim capacitors and metal finger capacitors for analog and rf applications. In 2004 RF and Microwave Conference (IEEE Cat. No. 04EX924), pages 85-89, October 2004.

[22] A. Shrivastava, D. Akella Kamakshi, and B. H. Calhoun. A 1.5 nw, 32.768 khz xtal oscillator operational from a 0.3 v supply. IEEE Journal of Solid-State Circuits, 51(3):686-696, March 2016.

[23] R. Arya and J. P. Oliveira. Gm-c biquad filter for low signal sensor applications. In 2016 MIXDES-23rd International Conference Mixed Design of Integrated Circuits and Systems, pages 207-210, June 2016.

The invention claimed is:

1. A method comprising:

generating a biasing current ($I_0$) using a constant gm bias circuit operating in the subthreshold region for ultra-low power consumption, said circuit including a switched capacitor resistor having a first capacitor, wherein the biasing current ($I_0$) is given by:

$$I_0 = V_T \ln(M)/R_1,$$

where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant $g_m$ bias circuit, $$R_1 = 1/f_1 C_1,$$

$C_1$ is a capacitance of the first capacitor, and $f_1$ is a frequency of a reference clock of the constant gm bias circuit; and biasing a differential amplifier with the biasing current, the differential amplifier including a load switched capacitor resistor having a second capacitor, wherein the differential amplifier has constant gain ($A_v$), independent of manufacturing process variation or temperature variation, given by:

$$A_v = \ln(M) f_1 C_1 / \eta f_3 C_3,$$

where $\eta$ is a process constant value for the differential amplifier, $C_3$ is a capacitance of the second capacitor, and $f_3$ is a frequency of the load switched capacitor resistor of the differential amplifier.

2. The method of claim 1, wherein the method is implemented in a ultra-low power and lower area Internet of things (IoT) device.

3. A differential amplifier circuit, comprising:

(a) a constant gm bias circuit operating in the subthreshold region for ultra-low power consumption generating a biasing current ($I_0$), said constant gm bias circuit including a switched capacitor resistor having a first capacitor, wherein the biasing current ($I_0$) is given by:

$$I_0 = V_T \ln(M)/R_1,$$

where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $$R_1 = 1/f_1 C_1,$$

$C_1$ is a capacitance of the first capacitor, and $f_1$ is a frequency of a reference clock of the constant gm bias circuit; and (b) a differential amplifier biased with the biasing current, the differential amplifier including a load switched capacitor resistor having a second capacitor, wherein the differential amplifier has constant gain ($A_v$) given by:

$$A_v = \ln(M) f_1 C_1 / \eta f_3 C_3$$

where $\eta$ is a process constant value for the differential amplifier;

$C_3$ is a capacitance of the second capacitor, and $f_3$ is a frequency of the load switched capacitor resistor of the differential amplifier.

4. The differential amplifier circuit of claim 3, wherein the differential amplifier circuit is implemented in a ultra-low power and lower area Internet of things (IoT) device.

5. The differential amplifier circuit of claim 3, wherein the constant gm bias circuit includes one or more decoupling capacitors for suppressing ripple originating from the switched capacitor resistor in the constant gm bias circuit.

6. A second-order biquad filter, comprising:

(a) a constant gm bias circuit operating in the subthreshold region for ultra-low power consumption generating a biasing current ($I_0$), said constant gm bias circuit including a switched capacitor resistor having a first capacitor, wherein the biasing current ($I_0$) is given by:

$$I_0 = V_T \ln(M)/R_1,$$

where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $$R_1 = 1/f_1 C_1,$$

$C_1$ is a capacitance of the first capacitor, and $f_1$ is a frequency of a reference clock of the constant gm bias circuit; and (b) a second order biquad filter biased with the biasing current to obtain a stable cut-off frequency.

7. The second-order biquad filter of claim 6, wherein the second order biquad filter comprises four operational transconductance amplifiers, each transconductance amplifier having a second capacitor, wherein the unity gain frequency (UGF) of the second order biquad filter given by:

$$UGF = \ln(M) f_1 C_1 / \eta C_2$$

where $\eta$ is a constant value for the amplifiers, and $C_2$ is a capacitance of the second capacitor.

8. The second-order biquad filter of claim 6, wherein the second order biquad filter includes a plurality of third capacitors, and wherein the cut-off frequency of the second order biquad filter is given by $$W_o = \ln(M) f_1 C_1 / \eta C_4,$$

where $\eta$ is a constant value for the amplifiers, and where $C_4$ is a capacitance of the second capacitor.

9. The second-order biquad filter of claim 6, wherein second-order biquad filter is implemented in a ultra-low power and lower area Internet of things (IoT) device.

10. The second-order biquad filter of claim 6, wherein the constant gm bias circuit includes one or more decoupling capacitors for suppressing ripple originating from the switched capacitor resistor in the constant gm bias circuit.

11. A method comprising:

generating a biasing current ($I_0$) using a constant $g_m$ bias circuit operating in the subthreshold region for ultra-low power consumption, said circuit including a switched capacitor resistor having a first capacitor, wherein the biasing current ($I_0$) is given by:

$$I_0 = V_T \ln(M)/R_1,$$

where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1 C_1$, $C_1$ is a capacitance of the first capacitor, and $f_1$ is a frequency of a reference clock of the constant gm bias circuit, and wherein generating a biasing current ($I_0$) includes suppressing ripple originating from the switched capacitor resistor in the constant gm bias circuit using one or more decoupling capacitors.

12. A method comprising:

generating a biasing current ($I_0$) using a constant gm bias circuit operating in the subthreshold region for ultra-low power consumption, said circuit including a switched capacitor resistor having a first capacitor, wherein the biasing current ($I_0$) is given by:

$I_0 = V_T \ln(M)/R_1$, where $V_T$ is the thermal voltage of the constant $g_m$ bias circuit, where the thermal voltage is kT/q, where k is the Boltzman's constant, T is the temperature in Kelvin, and q is the unit of charge, M is a multiplication factor relating two transistors in the constant gm bias circuit, $R_1 = 1/f_1 C_1$, $C_1$ is a capacitance of the first capacitor, and $f_1$ is a frequency of a reference clock of the constant gm bias circuit; and biasing a second order biquad filter with the biasing current to obtain a stable cut-off frequency.

13. The method of claim 12, wherein the second order biquad filter comprises four operational transconductance amplifiers, each transconductance amplifier having a second capacitor, wherein the unity gain frequency (UGF) of the second order biquad filter given by:

$UGF = \ln(M) f_1 C_1 / \eta C_2$ where $\eta$ is a constant value for the amplifiers, and $C_2$ is a capacitance of the second capacitor.

14. The method of claim 13, wherein the second order biquad filter includes a plurality of third capacitors, and wherein the cut-off frequency of the second order biquad filter is given by $Wo = \ln(M) f_1 C_1 / \eta C_4$, where $\eta$ is a constant value for the amplifiers, and where $C_4$ is a capacitance of the second capacitor.

15. The method of claim 12, wherein the method is implemented in a ultra-low power and lower area Internet of things (IoT) device.

* * * * *